(12) United States Patent
Cosand

(10) Patent No.: US 6,975,682 B2
(45) Date of Patent: Dec. 13, 2005

(54) MULTI-BIT DELTA-SIGMA ANALOG-TO-DIGITAL CONVERTER WITH ERROR SHAPING

(75) Inventor: Albert E. Cosand, Agoura Hills, CA (US)

(73) Assignee: Raytheon Company, Waltham, MA (US)

( * ) Notice: Subject to any disclaimer, the term of this patent is extended or adjusted under 35 U.S.C. 154(b) by 756 days.

(21) Appl. No.: 09/879,470

(22) Filed: Jun. 12, 2001

(65) Prior Publication Data

US 2002/0186776 A1    Dec. 12, 2002

(51) Int. Cl.$^7$ ............................................... H04B 14/06
(52) U.S. Cl. ...................................... 375/247; 341/200
(58) Field of Search ............................... 375/245, 247, 375/243; 341/110, 131, 200

(56) References Cited

U.S. PATENT DOCUMENTS

| 3,544,993 A | 12/1970 | Gabriel |
| 3,665,250 A | 5/1972 | Cosand |
| 3,950,667 A | 4/1976 | DeJong et al. |

(Continued)

OTHER PUBLICATIONS

Baird, R. T., et al, "Linearity Enhancement of Multibit Delta Sigma A/D and D/A Covnerters Using Data Weighted Averaging, "IEEE Transactions on Circuits and Systems II: Analog and Digital Signal Processing, IEEE, New York, US, vol. 42, No. 12, pp. 753-762, Dec. 1, 1995, XP000553740, ISSN: 1057-7130, Figures 1, 12.

Primary Examiner—Dac V. Ha

(74) Attorney, Agent, or Firm—Leonard A. Alkov; Karl A. Vick

(57) ABSTRACT

A quantizer adapted for use with a delta-sigma analog-to-digital converter. The quantizer includes first and second comparators adapted to compare an input analog signal to a threshold and provide a digital output in response thereto. First and second thresholds are provided to the first and second comparators respectively. In accordance with the present teachings, a mechanism is provided for changing the thresholds to minimize conversion errors. While the mechanism for changing the thresholds may be implemented with resistive and/or capacitive ladders, in the illustrative embodiment, digital-to-analog converters are utilized. The DACs are driven by error shaping logic. The inventive quantizer allows for an improved delta-sigma analog-to-digital converter design which combines an ADC and a DAC. The DAC reconstructs the analog equivalent of the digital output of the ADC. The ADC is a flash converter consisting of one comparator per threshold. The DAC operates by summing the outputs of a set of nominally identical unit elements. The DAC has the same number of elements as there are comparators in the flash ADC and each comparator drives one element of the DAC. A novel feature is that the thresholds of the comparators in the ADC can individually be dynamically adjusted, so that the correspondence between an element of the DAC and a particular threshold of the ADC can be varied from sample to sample under the control of logic circuitry. This arrangement allows the correspondence between DAC elements and ADC thresholds to be remapped without introducing any additional delay into the signal path between the ADC and the DAC. In a high speed continuous-time delta sigma modulator, this allows randomization or shaping of the mismatch errors of the DAC elements to be achieved without incurring any penalty in sample rate, nor adding any excess delay into the loop that might destabilize or otherwise degrade the operation of the modulator.

4 Claims, 3 Drawing Sheets

U.S. PATENT DOCUMENTS

| | | |
|---|---|---|
| 4,251,803 A | 2/1981 | Debord et al. |
| 4,975,931 A | 12/1990 | Cosand |
| 5,128,534 A | 7/1992 | Wyles et al. |
| 5,304,951 A | 4/1994 | Cosand |
| 5,404,142 A | 4/1995 | Adams et al. |
| 6,346,898 B1 * | 2/2002 | Melanson .................. 341/143 |
| 6,642,873 B1 * | 11/2003 | Kuang ....................... 341/143 |
| 6,765,518 B2 * | 7/2004 | Olson et al. ................ 341/143 |

* cited by examiner

MULTI-BIT DELTA-SIGMA ANALOG-TO-DIGITAL CONVERTER WITH ERROR SHAPING

This invention was made with Government support under Contract N66001-97-C-8004 with the Department of the Navy. The Government has certain rights in this invention.

BACKGROUND OF THE INVENTION

1. Field of the Invention

The present invention relates to analog-to-digital converters. More specifically, the present invention relates to analog-to-digital converters having delta-sigma modulators.

2. Description of the Related Art

Currently 'oversampled' delta-sigma modulator type analog-to-digital (ADC) converters are used for applications (such as audio) requiring accurate conversion of analog signals to digital signals at high speed. Sigma-delta modulator (ADC) converters include a delta-sigma modulator and a digital filter, which processes the output thereof. The delta-sigma modulators allow for the use of low resolution components running at a higher sampling rate to provide a high resolution ADC converter at a lower sampling rate. The delta-sigma modulators allow for lower costs and higher accuracy than could otherwise be achieved without a delta-sigma modulator.

There is an ongoing need to increase the sampling rate (operating frequency) to higher frequencies for digital receivers, radar receivers and other applications requiring high rate ADC conversion.

A digital-to-analog converter (DAC) is typically implemented within the delta-sigma modulator as a feedback element, the precision of which limits the precision of the delta-sigma modulator. The precision of the DAC converter is, in turn, limited by the ability of the designer to match elements in the DAC in the fabrication process. To address this problem, error-shaping techniques are often used in the art to minimize the DAC error effects over the passband of the modulator.

Prior implementations of error shaping or error randomization for the feedback DAC in a continuous-time delta-sigma modulator have required switching or multiplexing circuitry between the ADC and the DAC. The delay through this circuitry is effectively added to the minimum allowable time for a half period, of the sampling clock, and thus reduces the maximum sampling frequency and the achievable signal bandwidth for a given oversampling ratio.

In addition, the extra circuitry between the ADC and the DAC may introduce timing jitter or other timing related errors that would raise the noise floor of the delta-sigma modulator, thereby reducing its dynamic range.

Hence, there is a need in the art for a system or technique for increasing the speed of delta-sigma ADC converters while eliminating the problems associated therewith.

SUMMARY OF THE INVENTION

The present invention addresses the need in the art for a fast, linear, low noise multi-bit feedback DAC design for a high-speed continuous-time delta-sigma modulator for an oversampled analog to digital converter (ADC). The invention includes a quantizer adapted for use with a delta-sigma analog-to-digital converter. The quantizer includes a multiplicity of comparators adapted to compare an input analog signal to a set of thresholds and provide a digital output in response thereto. (Appropriate thresholds are provided to the comparators respectively.) In accordance with the present teachings, a mechanism is provided for changing the thresholds to minimize conversion errors. While the mechanism for changing the thresholds may be implemented with resistive and/or capacitive ladders, in the illustrative embodiment, digital-to-analog converters are utilized. The DACs are driven by error shaping logic.

The inventive quantizer allows for an improved delta-sigma analog-to-digital converter design. The improved ADC converter includes a mechanism for combining a feedback signal with a signal representative of an input signal to provide an intermediate signal. A second mechanism is provided for quantizing the intermediate signal and providing an output signal. As described above, the quantizer includes plural comparators adapted to compare the intermediate signal to a set of thresholds and provide digital output signals in response thereto. The quantizer further includes an equal number of digital-to-analog converters for providing thresholds to the comparators. The DACs are driven by error shaping circuits in response to the output of the comparators. The outputs of the comparators are fed back to the combiner.

The invention combines an ADC and a DAC. The DAC reconstructs the analog equivalent of the digital output of the ADC. In the preferred embodiment, the ADC is a flash converter consisting of one comparator per threshold. The DAC operates by summing the outputs of a set of nominally identical unit elements. The DAC has the same number of elements as there are comparators in the flash ADC and each comparator drives one element of the DAC. A novel feature is that the thresholds of the comparators in the ADC can individually be dynamically adjusted, so that the correspondence between an element of the DAC and a particular threshold of the ADC can be varied from sample to sample under the control of logic circuitry.

This arrangement allows the correspondence between DAC elements and ADC thresholds to be remapped without introducing any additional delay into the signal path between the ADC and the DAC. In a high speed continuous-time delta sigma modulator, this allows randomization or shaping of the mismatch errors of the DAC elements to be achieved without incurring any penalty in sample rate, nor adding any excess delay into the loop that might destabilize or otherwise degrade the operation of the modulator.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
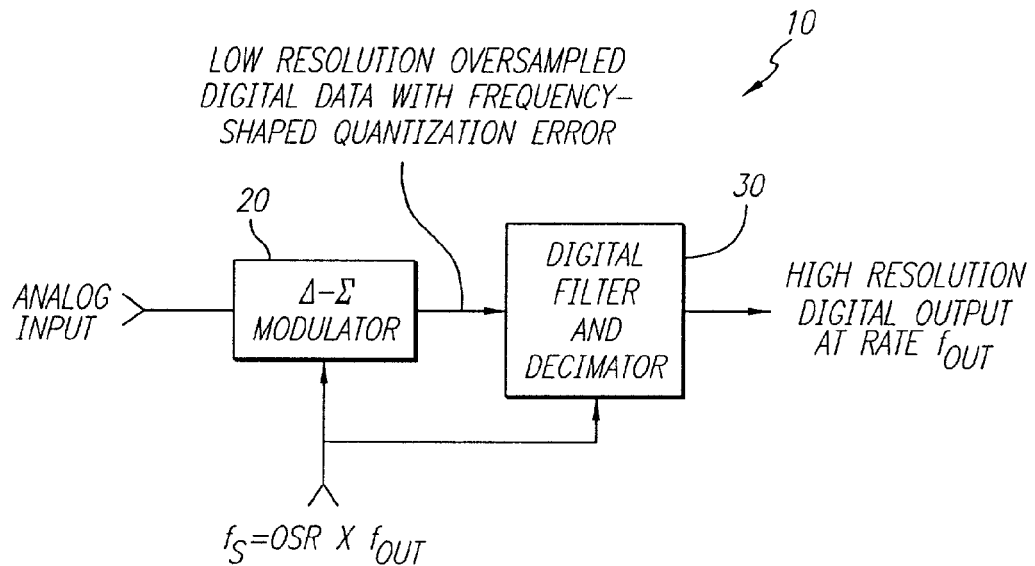
FIG. 1 is a top-level block diagram of a delta-sigma analog to digital converter incorporating the teachings of the present invention.

FIG. 1 is a top-level block diagram of a delta-sigma analog to digital converter incorporating the teachings of the present invention. The ADC 10 includes a delta-sigma modulator 20 and a digital filter and decimator 30. (The digital filter and decimator 30 may be of conventional design and construction.) The ADC digitizes an analog input signal which consists of components within some prescribed bandwidth that can be represented by sampled data at the output sample rate $f_{out}$. The sample rate of the modulator, $f_s$, is higher than the output rate by the oversampling ratio, OSR. The output of the modulator 20, at the high rate $f_s$, has a low resolution (low number of bits), but has the property that the quantization error resulting from the low resolution is shaped in frequency to minimize its amplitude within the desired analog input bandwidth. The subsequent digital filter and decimator passes only the frequency band containing the input signal, so that most of the quantization error is blocked and reduces the sample rate to $f_{out}$. The result is a high-resolution (high number of bits and low quantization error) data stream at the rate $f_{out}$ that accurately represents the analog input.

Figure 2:
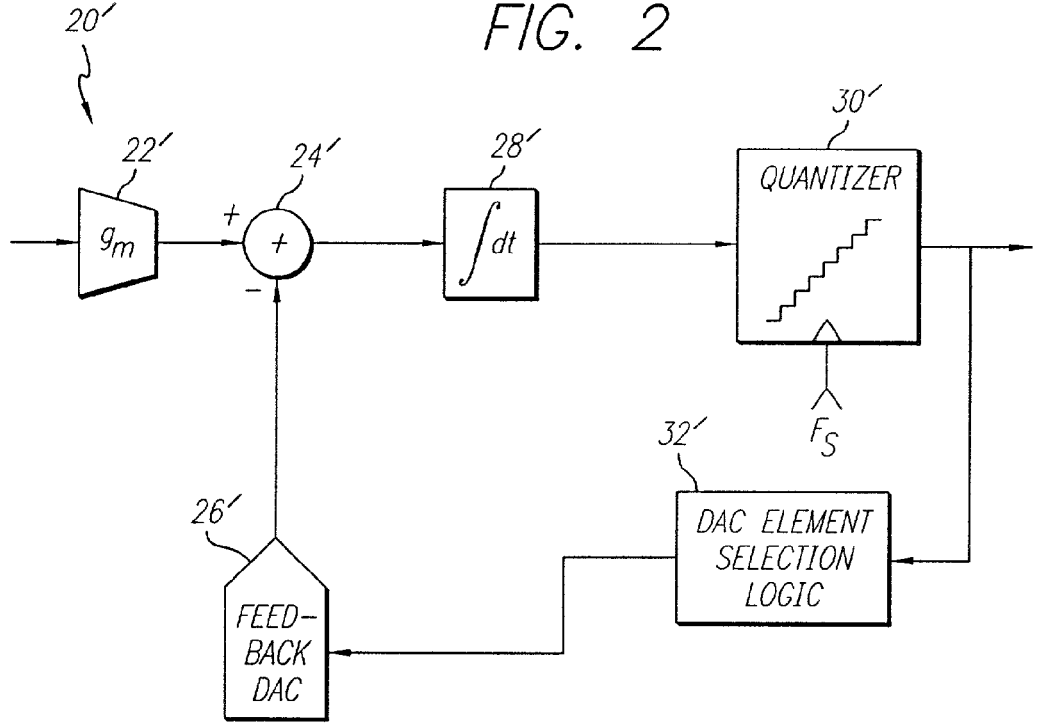
FIG. 2 is a block diagram of a delta sigma modulator constructed in accordance with conventional teachings.

FIG. 2 is a block diagram of a simple version delta sigma modulator 20' constructed in accordance with conventional teachings. The conventional delta sigma modulator 20' adds delay into the critical feedback path for a high-speed continuous-time modulator and includes a mutual transconductance 22' which converts an input voltage to an output current. This current is combined by a summer 24' with a feedback signal provided by a feedback DAC 26'. The output of the summer is input to an integrator 28'. The integrated signal is input to a quantizer 30' which is typically implemented with a plurality of comparators with fixed thresholds. The outputs of the comparators provide a digital output of the quantizer. The output of the quantizer is fed back to the feedback DAC 26' via an error shaping circuit 32'. The error shaping circuit is implemented as DAC element selection logic. The DAC element selection logic feeds a signal to the feedback DAC effective to minimize conversion (feedback) error. The DAC feedback errors are equivalent to input errors and, as such, may be a limiting factor in the overall performance of the ADC. Also, delay through the quantizer and DAC limit the achievable stable gain in the feedback loop, and thus the degree to which quantization noise can be suppressed, which again may be one of the limiting factors in ADC performance. This is particularly true for more complex modulators. The overall accuracy of the delta-sigma modulator depends on the correspondence between the analog signal from the feedback DAC and the digital output of the modulator.

The architecture of choice for highest speed is an array of N comparators for the quantizer 30' and a DAC 26' of N equally weighted switched current sources, where each comparator directly drives one DAC current switch. The outputs of the DAC current switches drive directly into the current summing node 24'. The unit of output of the DAC 26' is the quantity of charge equal to the product of the unit DAC element current and the length of a single DAC output sample.

Unfortunately, as mentioned above, implementations of such prior art error shaping techniques for the feedback DAC in continuous-time, delta-sigma modulators have imposed a substantial delay between the ADC (28', 30') and the DAC (26'). The delay through this circuitry is effectively added to the minimum allowable time for a half period, of the sampling clock, and thus reduces the maximum sampling frequency and the achievable signal bandwidth for a given oversampling ratio.

Another source of error in the DAC is the mismatch between the nominally identical unit current sources. Numerous error shaping algorithms exist in the art for choosing the order in which DAC elements are used in an oversampled DAC such that the effects of mismatch errors between the individual elements are substantially cancelled over some range of frequencies. Since it is not known before the sample time how many elements of the DAC will be switched on; the algorithm assigns a priority for usage to a particular element. The elements with the highest priorities to be used are assigned to the comparators which will turn on first, i.e., those with the lowest values of threshold voltage. Conventionally, the comparator inputs are driven through a resistor ladder network that establishes a fixed relationship of threshold voltages amongst the comparators. The assignment of high priority DAC elements to low threshold comparator elements is then done with a switching matrix, or some equivalent switching circuitry, between the quantizer outputs and the DAC element switches.

Hence, a need has remained in the art for a system or technique for increasing the speed of delta-sigma ADC converters while eliminating the problems associated therewith.

Figure 3:
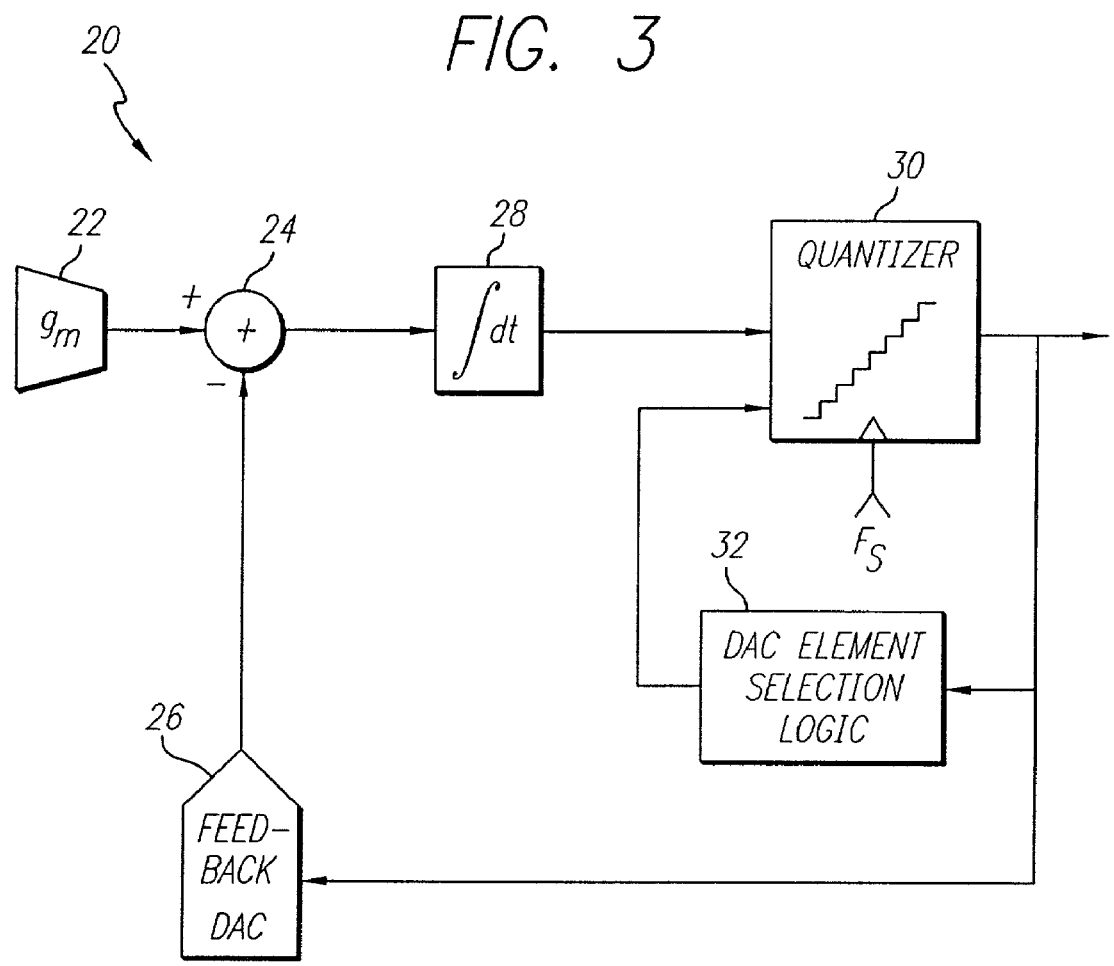
FIG. 3 is a block diagram of a delta sigma modulator constructed in accordance with the teachings of the present invention.

FIG. 3 is a block diagram of a delta sigma modulator 20 constructed in accordance with the teachings of the present invention. The modulator 20 is similar to the modulator 20' of FIG. 2 with the exceptions that:

1) the quantizer 30 is of a novel and unique design as discussed more fully below,
2) the feedback DAC 26 is fed directly by the output of the quantizer 30,
3) the output of the DAC element selection logic 32 is provided to the quantizer 30, and
4) the error shaping logic is implemented in accordance with the teachings of a copending patent application filed by the present applicant and entitled "Bandshaped Mismatch-Error Cancellation For An Oversampled Digital-to-Analog Converter" (Atty. Docket No. PD R98091), the teachings of which are incorporated herein by reference.

Figure 4:
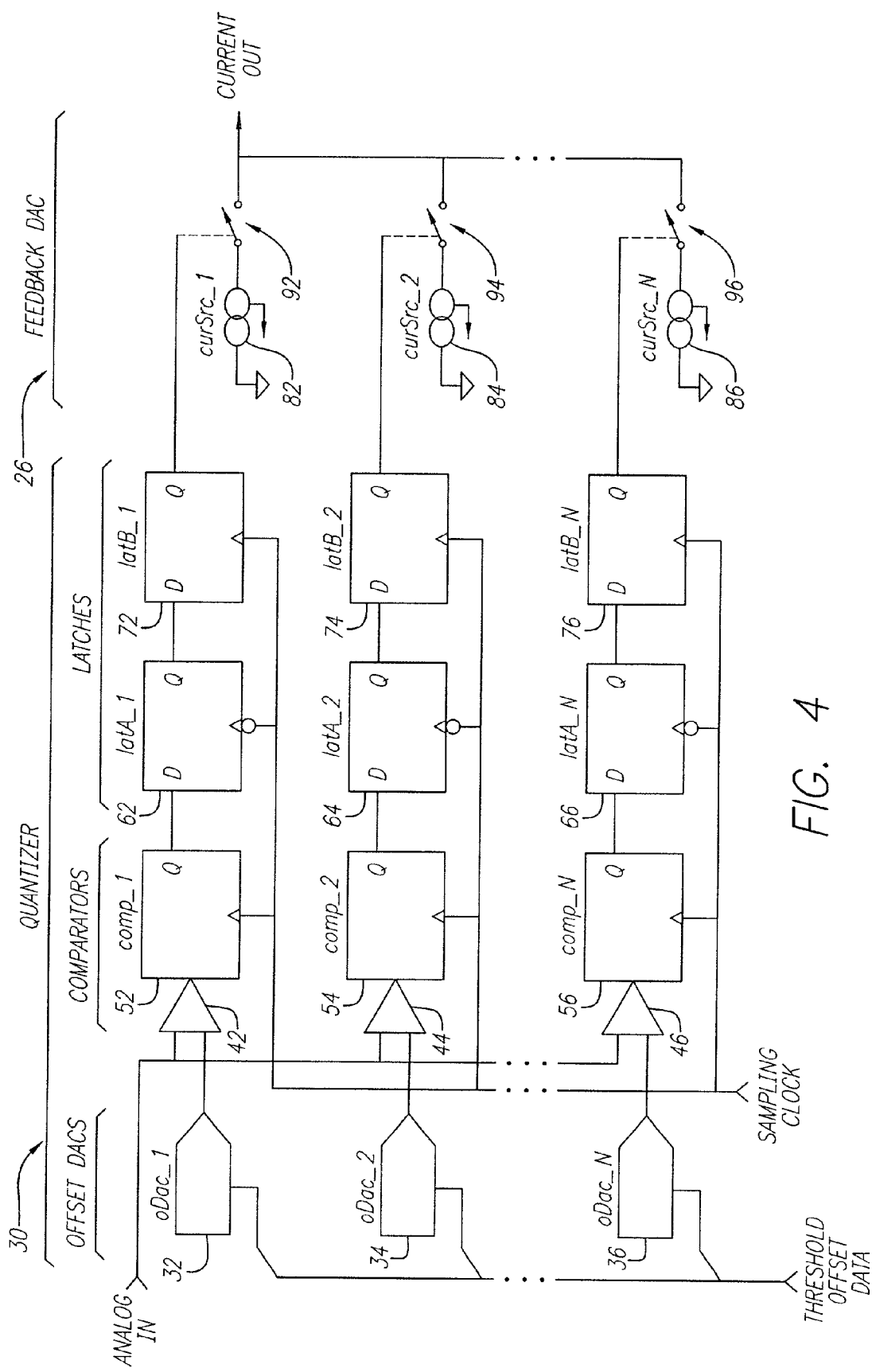
FIG. 4 is a schematic diagram of the quantizer of the delta sigma modulator of FIG. 3.

FIG. 4 is a schematic diagram of the quantizer 30 of the delta sigma modulator of FIG. 3. The quantizer 30 includes an array of N auxiliary (offset) DACs 32, 34 and 36. Each auxiliary DAC 32, 34 and 36 receives threshold offset data from the DAC Element Selection Logic 32 and sets the threshold of each of a plurality of comparators 42, 44 and 46, respectively. The outputs of the comparators are latched in a conventional manner. The outputs of the latches (72, 74 and 76) are used to switch current sources (82, 84 and 86) into an output node.

In accordance with the present teachings, a reassignment of the relationship between comparator thresholds and DAC element switches is accomplished by dynamically shifting the comparator thresholds while maintaining a fixed connection between a particular comparator output and a DAC switch. This is accomplished with the array of N auxiliary DACs 32, 34 and 36 that drive each of a corresponding number of comparator threshold inputs individually, as shown in FIG. 4, so that low thresholds can be assigned to the comparators connected to high priority elements in the feedback DAC 26. These auxiliary DACs 32, 34 and 36 are selected to have a much less stringent accuracy requirement than does the feedback DAC 26, as any errors introduced by these DACs are equivalent to quantization errors in the quantizer and are suppressed by the full loop gain of the delta-sigma modulator. The auxiliary DACs do not introduce any discrepancy between the digital output of the modulator and the analog output of the feedback DAC. That is, the present invention allows the correspondence between comparator thresholds and feedback DAC elements to be reassigned and does not compromise the comparator regeneration time nor introduce any extra delay into the path through the quantizer and feedback DAC.

The principal advantage of the present invention is the elimination of unnecessary variable delay in the critical path between the quantizer output and the DAC switches. It is generally desired that delays associated with the quantizer and feedback DAC be controlled by clock signals. In particular, the clocking of the feedback DAC switches defines the overall ADC sampling, jitter, and should be very precise. The minimum increment of delay that is easily controlled by clocking is one-half period of the sampling clock.

The full quantizer and feedback DAC, shown in FIG. 4, contains N identical signal paths. In each path, the comparator is functionally equivalent to a D latch, which tracks the input (is transparent) when its clock is high, and has positive feedback when its clock is low so that its output is driven to a saturated, or limiting, logic state. Very fast comparators generally have low gain in the track mode, so that if the input to the comparator is close to the threshold voltage (voltage on the reference input of the comparator) the output may be much less than a full logic swing at the sampling time. In the regeneration mode, there is positive feedback so that the output voltage will build until it saturates at a full swing. If the starting voltage, when the comparator is switched to regeneration, is only a small fraction of a logic swing, the initial buildup will be exponential with a characteristic time constant called the 'regeneration time constant'. In order for the DAC switch to reproducibly operate at the correct time to accurately deliver a unit charge into the summing node, it must be driven by a full logic swing. If the comparator output is not yet settled when it is applied to the DAC switch, something less than a full pulse will be delivered to the summing node. The error thus produced appears to be a noise term in the DAC output. Depending on the noise floor required, it is usually necessary to allow at least five to ten times the regeneration time constant for the comparator to settle so that the incidence of shortened pulses is low enough to be ignored.

With the latching scheme in FIG. 4, the latch immediately after the comparator (62, 64, 66) is in track mode while the comparator (42, 44, 46) is regenerating, so its output will follow the comparator output an exponential buildup and saturation. One half clock period following the sampling time, the second latch after the comparator (72, 74, 76) will be switched from hold to track and its output will then follow the output of the first latch. If the comparator and first latch have settled to a full, saturated logic swing within the half clock period then the second latch output will switch in a reproducible manner and thus be suitable for driving the DAC switch. The timing constraint for maximum sample rate is then seen to be that one half period of the sample clock must include the propagation delay of a latch plus the requisite number of comparator time constants to ensure an adequately low noise floor.

If a switching matrix or equivalent circuitry between the comparators and the DAC switches is used to remap the connections between comparators and DAC elements, it will introduce additional delay. It will probably also introduce some variation in the delay that depends on the particular remapping chosen. In order to keep this circuitry from introducing additional errors due to timing variations, it should be isolated from the DAC switches by at least two latches. If it is placed between the comparator output and the first latch after the comparator, its delay adds directly to the minimum acceptable half-period of the sampling clock. This limits the maximum usable sample rate and thus the achievable oversampling ratio for the delta-sigma modulator. If an additional rank of latches were to be added between the quantizer and the DAC switches to accommodate the circuit delay without compromising the regeneration time, the additional overall delay would seriously degrade the feedback loop response.

It is also worth noting that algorithms for error cancellation require that the errors be repeatable. With a fixed path from each comparator to one DAC switch, there should be no variation in subtle timing errors that may result from different settings of switching circuitry between the quantizer and DAC. Consequently, the technique of changing comparator thresholds may provide more accurate cancellation than can, in practice, be achieved with switching circuitry between the quantizer and the DAC.

The present teachings are, of course, also applicable to the case where the DAC errors are simply randomized in order to minimize spurious responses, without resorting to the use of an error-canceling algorithm.

One constraint that should be satisfied for this invention to be implementable is that the priority of DAC element usage must not depend on the quantizer output from the current sample, but must depend only on DAC element usage in previous samples. The implementation of an error shaping algorithm must be such that the priorities for a particular sample can be determined and decoded into appropriate drive signals to the auxiliary DACs with enough timing margin to allow these DACs to settle before the sampling time. For some algorithms, such as the one described in above-referenced patent incorporated herein by reference (Atty. docket No. PD R98091), "Bandshaped mismatch error cancellation," this is easily satisfied. This approach is not, however, applicable to an algorithm such as that described by Adams and Kwan in U.S. Pat. No. 5,404,142, "Data-Directed Scrambler For Multi-Bit Noise-Shaping D/A Converters," (the teachings of which are incorporated herein by reference) where data from the present sample is used in determining which DAC elements are to be used.

The raw output of the quantizer is a number of data lines equal to the number of comparators in the quantizer. It is normally convenient to convert this to a more compact format, such as some form of a binary number. The most common schemes for performing this conversion on the output of a parallel, or flash, quantizer rely on a fixed ordering of the quantizer thresholds, which is not true in this case. A simple method that can be used is to sum the quantizer outputs with an adder tree. Ideally, the inputs to the adder should be taken from the latches that drive the feedback DAC switches. This has the advantage of minimizing discrepancies between the digital output and the analog output of the feedback DAC that could result from comparator meta-stability. It is also completely insensitive to "bubble" errors in the quantizer output, where the effective comparator thresholds appear misplaced so that the output as a function of position in the array does not abruptly change from all "on" to all "off."

In some cases it may be convenient to implement a distributed structure for the auxiliary DACs that set the comparator thresholds, where, for instance, a small set of fine DACs are common to groups of comparators, each of which has a coarse DAC with lower resolution than would be the case if there were simply one DAC per comparator input.

Thus, the present invention has been described herein with reference to a particular embodiment for a particular application. Those having ordinary skill in the art and access to the present teachings will recognize additional modifications, applications and embodiments within the scope thereof. For example, the invention is not limited to the use of auxiliary DACs to set the variable comparator thresholds. Any suitable circuitry could be used without departing from the scope of the present teachings including, without limitation, resistive ladders, capacitive ladders and other suitable arrangements.

It is therefore intended by the appended claims to cover any and all such applications, modifications and embodiments within the scope of the present invention.

Accordingly,

What is claimed is:

1. A quantizer for use with a delta-sigma analog-to-digital converter, said quantizer comprising:
   first and second comparators adapted to compare an input analog signal to a threshold and provide a digital output in response thereto;
   first digital-to-analog converter for providing a first threshold and second digital-to-analog converter for providing a second threshold to said first and second comparators respectively; and
   means for changing said first or said second threshold.

2. The invention of claim 1 wherein said means for changing said first or said second threshold is a logic circuit that provides a digital input for said first or said second digital-to-analog converter.

3. The invention of claim 2 wherein said logic circuit is an error shaping circuit.

4. The invention of claim 2 wherein said logic circuit is a digital-to-analog converter element selection logic circuit.

* * * * *